(12) United States Patent
Lee et al.

(10) Patent No.: US 8,891,315 B2
(45) Date of Patent: Nov. 18, 2014

(54) NONVOLATILE MEMORY DEVICE AND ERASE METHOD THEREOF

(71) Applicants: ChangHyun Lee, Suwon-si (KR); Byoungkeun Son, Hwaseong-si (KR)

(72) Inventors: ChangHyun Lee, Suwon-si (KR); Byoungkeun Son, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/827,674

(22) Filed: Mar. 14, 2013

(65) Prior Publication Data

US 2013/0329496 A1 Dec. 12, 2013

(30) Foreign Application Priority Data

Jun. 7, 2012 (KR) .................. 10-2012-0061117

(51) Int. Cl.
*G11C 11/34* (2006.01)
*G11C 16/16* (2006.01)
*G11C 16/34* (2006.01)
*G11C 16/04* (2006.01)

(52) U.S. Cl.
CPC ............ *G11C 16/3445* (2013.01); *G11C 16/16* (2013.01); *G11C 16/0483* (2013.01)
USPC ............ 365/185.26; 365/185.01; 365/185.03; 365/185.11; 365/185.17; 365/185.18; 365/185.23; 365/185.29

(58) Field of Classification Search
CPC ............ G11C 16/3445; G11C 16/344; G11C 16/3404; G11C 16/3436; G11C 16/04; G11C 16/3409; G11C 11/5635; G11C 8/12; G11C 11/5621; G11C 11/5671; G11C 16/0425; G11C 16/0458; G11C 11/5642; G11C 16/3413; G11C 16/3431; G11C 17/18; G11C 2216/14; G11C 29/50; G11C 16/16; G11C 16/0483
USPC ............ 365/185.01, 185.03, 185.11, 185.17, 365/185.18, 185.23, 185.26, 185.29
See application file for complete search history.

(56) References Cited

U.S. PATENT DOCUMENTS

| | | | |
|---|---|---|---|
| 7,239,556 B2 | 7/2007 | Abe et al. | |
| 7,248,500 B2 | 7/2007 | Tamada et al. | |
| 7,301,815 B2 | 11/2007 | Kurata et al. | |
| 7,652,926 B2 | 1/2010 | Kang et al. | |
| 7,802,054 B2 | 9/2010 | Park et al. | |
| 7,872,917 B2 | 1/2011 | Kawamura | |
| 7,924,622 B2 | 4/2011 | Lee et al. | |
| 8,027,194 B2 | 9/2011 | Lee et al. | |
| 8,089,811 B2 | 1/2012 | Kang et al. | |
| 8,122,193 B2 | 2/2012 | Song et al. | |
| 8,315,103 B2 | 11/2012 | Lee et al. | |
| 2005/0180213 A1 | 8/2005 | Abe et al. | |
| 2006/0039230 A1 | 2/2006 | Kurata et al. | |

(Continued)

FOREIGN PATENT DOCUMENTS

JP 7-30000 A 1/1995

*Primary Examiner* — Fernando Hidalgo
(74) *Attorney, Agent, or Firm* — Sughrue Mion, PLLC (57) ABSTRACT

A method of erasing a nonvolatile memory device, which includes a plurality of memory blocks each formed of a plurality of strings, includes applying an erase voltage to a well of a selected memory block of the memory blocks, each memory block including at least two dummy cells located between a string or ground selection transistor and memory cells; and applying or inducing different levels of voltages to respective gates of the at least two dummy cells.

20 Claims, 11 Drawing Sheets

(56) References Cited

U.S. PATENT DOCUMENTS

| | | |
|---|---|---|
| 2006/0136676 A1 | 6/2006 | Park et al. |
| 2006/0158932 A1 | 7/2006 | Tamada et al. |
| 2007/0106836 A1 | 5/2007 | Lee et al. |
| 2007/0223273 A1 | 9/2007 | Kang et al. |
| 2009/0046505 A1 | 2/2009 | Lee et al. |
| 2009/0135656 A1 | 5/2009 | Park |
| 2009/0180319 A1 | 7/2009 | Kawamura |
| 2009/0244967 A1 | 10/2009 | Kim et al. |
| 2009/0310408 A1 | 12/2009 | Lee et al. |
| 2009/0316487 A1 * | 12/2009 | Lee et al. ............ 365/185.22 |
| 2010/0010040 A1 | 1/2010 | Jones et al. |
| 2010/0046290 A1 * | 2/2010 | Park et al. ............ 365/185.2 |
| 2010/0062715 A1 | 3/2010 | Kim et al. |
| 2010/0082890 A1 | 4/2010 | Heo et al. |
| 2010/0097862 A1 | 4/2010 | Kang et al. |
| 2010/0217927 A1 | 8/2010 | Song et al. |
| 2010/0309237 A1 | 12/2010 | Roh |
| 2010/0315325 A1 | 12/2010 | Hwang |
| 2011/0222340 A1 | 9/2011 | Lee et al. |
| 2012/0051138 A1 * | 3/2012 | Kim et al. ............ 365/185.17 |
| 2012/0120740 A1 * | 5/2012 | Shim et al. ............ 365/189.14 |

* cited by examiner

NONVOLATILE MEMORY DEVICE AND ERASE METHOD THEREOF

CROSS-REFERENCE TO RELATED APPLICATIONS

A claim for priority under 35 U.S.C. §119 is made to Korean Patent Application No. 10-2012-0061117 filed Jun. 7, 2012, in the Korean Intellectual Property Office, the entire contents of which are hereby incorporated by reference.

BACKGROUND

Apparatuses and methods consistent with exemplary embodiments relate to a nonvolatile memory device and an erase method thereof.

A semiconductor memory device may be volatile (hereinafter, referred to as a volatile memory device) or nonvolatile (hereinafter, referred to as a nonvolatile memory device). A nonvolatile memory device retains contents stored therein even at power-off. Data stored in the nonvolatile memory device is permanent or reprogrammed according to fabrication technology used. Nonvolatile memory devices are used for program and microcode storage in a wide variety of applications in the computer, avionics, telecommunications, and consumer electronics industries.

SUMMARY

According to an aspect of an exemplary embodiment, there is provided a method of erasing a nonvolatile memory device which includes a plurality of memory blocks each formed of a plurality of strings, the method including applying an erase voltage to a well of a selected memory block of the memory blocks, each memory block including at least two dummy cells located between a string or ground selection transistor and memory cells; and applying or inducing different levels of voltages to respective gates of the at least two dummy cells.

According to an aspect of another exemplary embodiment, there is provided a nonvolatile memory device including a memory cell array including a plurality of memory blocks each formed of a plurality of strings, each string including at least one string selection transistor, string dummy cells, a plurality of memory cells, ground dummy cells, and at least one ground selection transistor connected in series between a corresponding bit line and a common source line or each string including at least one string selection transistor, string dummy cells, a plurality of memory cells, and at least one ground selection transistor connected in series between a corresponding bit line and the common source line; an address decoder configured to select a memory block of the plurality of memory blocks according to an address; a voltage generator configured to generate an erase voltage; an input and output circuit connected with bit lines and configured to read data stored at the memory cells or to store data at the memory cells; and a control logic configured to control the voltage generator so as to generate the erase voltage, and the control logic configured to control the address decoder and the input and output circuit so as to perform an erase operation of the selected memory block, wherein in each of the strings of the selected memory block, different levels of voltages are provided to gates of the string dummy cells or to gates of the ground dummy cells to reduce a horizontal electric field generated between the string or ground selection transistor and the memory cells.

According to an aspect of another exemplary embodiment, there is provided a method of erasing a nonvolatile memory device, the method including selecting a memory block of a plurality of memory blocks according to an address; applying an erase voltage to a well of the selected memory block according to an erase command; and applying different voltages to gates of at least two dummy cells connected in series.

BRIEF DESCRIPTION OF THE FIGURES

The above and other aspects of the exemplary embodiments will become apparent from the following description with reference to the following figures, wherein like reference numerals refer to like parts throughout the various figures unless otherwise specified, and wherein.

DETAILED DESCRIPTION

Embodiments will be described in detail with reference to the accompanying drawings. The inventive concept, however, may be embodied in various different forms, and should not be construed as being limited only to the illustrated exemplary embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A nonvolatile memory device according to an embodiment of the inventive concept may be a NAND flash memory, a vertical NAND flash memory, a NOR flash memory, a Resistive Random Access Memory (RRAM), a Phase-change RAM (PRAM), a Magnetroresistive RAM (MRAM), a Ferroelectric RAM (FRAM), a Spin Transfer Torque RAM (STT-RAM), etc. Further, the nonvolatile memory device according to an embodiment of the inventive concept can be implemented to have a three-dimensional array structure. The inventive concept is applicable to a flash memory device, in which a charge storage layer is formed of a conductive floating gate, and a charge trap flash (CTF) memory, in which a charge storage layer is formed of an insulation film. For ease of description, a nonvolatile memory device 100 may be assumed to be a NAND flash memory device.

Figure 1:
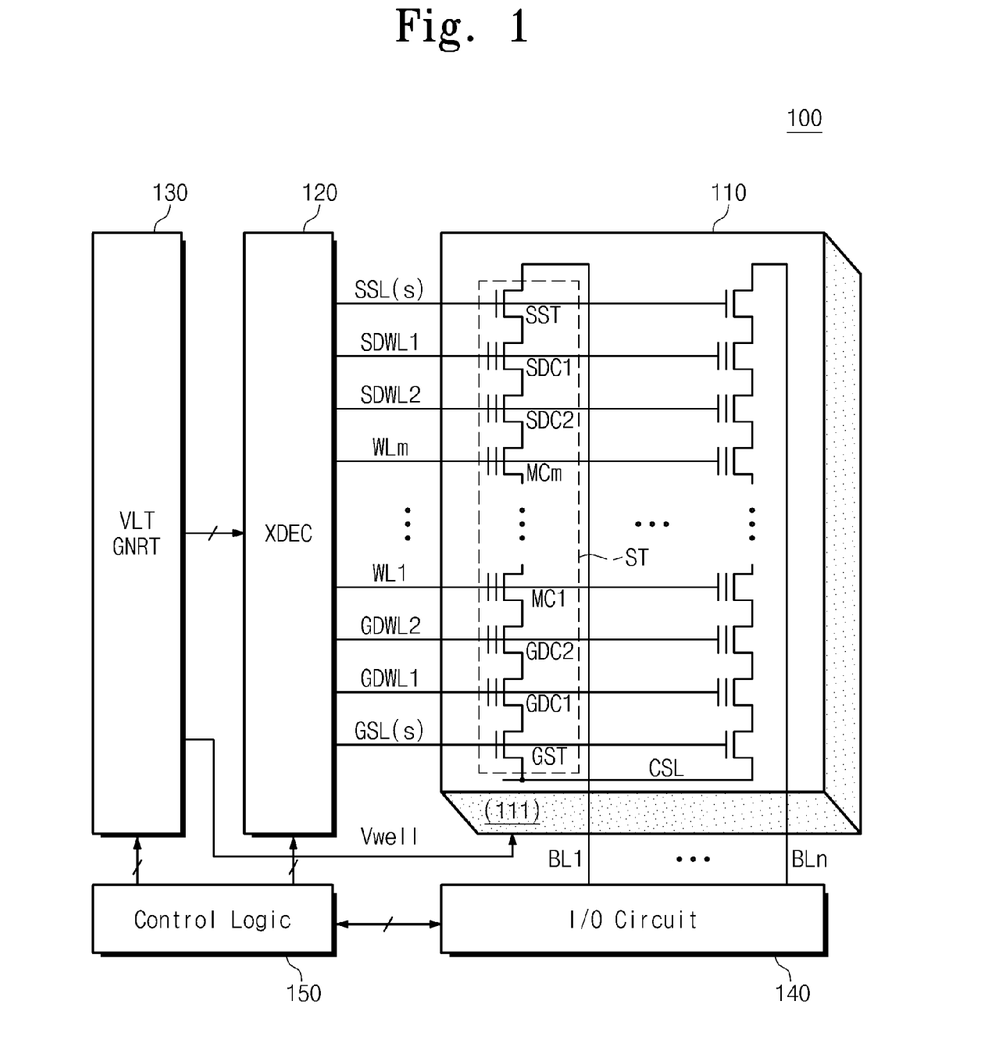
FIG. 1 is a block diagram schematically illustrating a nonvolatile memory device according to an exemplary embodiment.

FIG. 1 is a block diagram schematically illustrating a nonvolatile memory device according to an exemplary embodiment. Referring to FIG. 1, a nonvolatile memory device 100 may include a memory cell array 110, a row decoder 120, a voltage generator 130, an input/output (I/O) circuit 140, and a control logic 150.

The memory cell array 110 may include a plurality of memory blocks. Each of the memory blocks may be formed on a well (e.g., 111). In FIG. 1, for ease of description, there is illustrated one memory block. The memory block may include strings ST connected respectively with bit lines BL1 to BLn (n being a natural number).

Each string ST may include at least ground selection transistor GST, ground dummy cells GDC1 and GDC2, a plurality of memory cells MC1 to MCm (m being a natural number), string dummy cells SDC1 and SDC2, and at least one string selection transistor SST which are serially connected between a common source line CSL and a corresponding bit line. The ground and string selection transistors GST and SST may be formed to have the same structure.

In each string ST, the at least one string selection transistor SST may be driven by a voltage transferred through at least one string selection line SSL. A threshold voltage of the string selection transistor SST may be adjusted through a program operation or a read operation.

In each string ST, the at least one ground selection transistor GST may be driven by a voltage transferred through at least one ground selection line SSL. A threshold voltage of the ground selection transistor GST may be adjusted through a program operation or a read operation.

The memory cells MC1 to MCm in each string ST may store at least one data bit, and may be driven by voltages transferred through corresponding word lines WL1 to WLm, respectively.

In each string ST, the string dummy cells SDC1 and SDC2 may be driven by voltages transferred via string dummy word lines SDWL1 and SDWL2, respectively. In FIG. 1, there is illustrated an example in which each string ST includes two string dummy cells. However, the inventive concept is not limited thereto. For example, each string ST can be formed to include three or more string dummy cells. In example embodiments, different voltages may be applied to the string dummy word lines SDWL1 and SDWL2 at an erase operation, respectively.

In each string ST, the ground dummy cells GDC1 and GDC2 may be driven by voltages transferred via ground dummy word lines GDWL1 and GDWL2, respectively. In FIG. 1, there is illustrated an example in which each string ST includes two ground dummy cells. However, the inventive concept is not limited thereto. For example, each string ST can be formed to include three or more ground dummy cells. In example embodiments, different voltages may be applied to the ground dummy word lines GDWL1 and GDWL2 at an erase operation, respectively.

In FIG. 1, there is illustrated an example in which each string ST includes both string dummy cells and ground dummy cells. However, the inventive concept is not limited thereto. For example, each string ST can be formed to include either string dummy cells or ground dummy cells.

The row decoder 120 may select one of the memory blocks in response to an address, and may provide word line voltages (e.g., a program voltage, a pass voltage, an erase voltage, a verification voltage, a read voltage, a read pass voltage, etc.) with corresponding word lines.

The voltage generator 130 may generate the word line voltages and a well voltage Vwell. The well voltage Vwell may be applied to the well 111 on which the memory block is formed. Although not shown in FIG. 1, the voltage generator 130 may include a high voltage generator for generating a high voltage, a low voltage generator for generating a low voltage, and a negative voltage generator for generating a negative voltage.

At a program operation, the input/output circuit 140 may temporarily store data input from an external device to load onto a selected page. At a read operation, the input/output circuit 140 may temporarily store data read from a selected page to output to the external device. Although not shown in FIG. 1, the input/output circuit 140 may include page buffers corresponding to respective bit lines BL0 to BLn. Each of the page buffers may include at least one latch, which is configured to temporarily store data to be programmed at a memory cell connected to a corresponding bit line or data read from a memory cell connected to a corresponding bit line.

The control logic 150 may control an overall operation of the nonvolatile memory device 100. The control logic 150 may analyze control signals and command from the external device, and may control the row decoder 120, the voltage generator 130, and the input/output circuit 140 according to the analyzed result. For example, the control logic 150 may control the voltage generator 130 to generate voltages for driving (e.g., programming, reading, erasing, etc.), the row decoder 120 to transfer the generated voltages to the word lines WL0 to WLm, and the input/output circuit 140 to input page data to be programmed or to output page data read.

In example embodiments, the control logic 150 may control the row decoder 120, the voltage generator 130, and the input/output circuit 140 in response to an erase command so as to apply different voltages to gates of the string dummy cells SDC1 and SDC2, and different voltages to gates of the ground dummy cells GDC1 and GDC2.

A related art nonvolatile memory device may include a dummy cell provided with a dummy voltage at an erase operation. As an interval between elements is reduced, a horizontal electric field between the dummy cell and a memory cell closest to the dummy cell at an erase operation may be sharply increased. In this case, erase fail may be generated when electrons are trapped by the selection transistor SST/GST.

In contrast, in the exemplary embodiments, the horizontal electric field may be prevented from sharply increasing at an erase operation by providing at least two string dummy cells SDC1 and SDC2 between the string selection transistor SST and a memory cell closest to the string selection transistor SST, at least two ground dummy cells GDC1 and GDC2 between the ground selection transistor GST and a memory cell closest to the ground selection transistor GST, and applying different voltages to the string dummy cells SDC1 and SDC2 and different voltages to the ground dummy cells GDC1 and GDC2. In this case of an erase operation, the above-described electron trap phenomenon of the selection transistors SST and GST may be reduced. In other words, in the exemplary embodiments, erase fail may be reduced.

Figure 2:
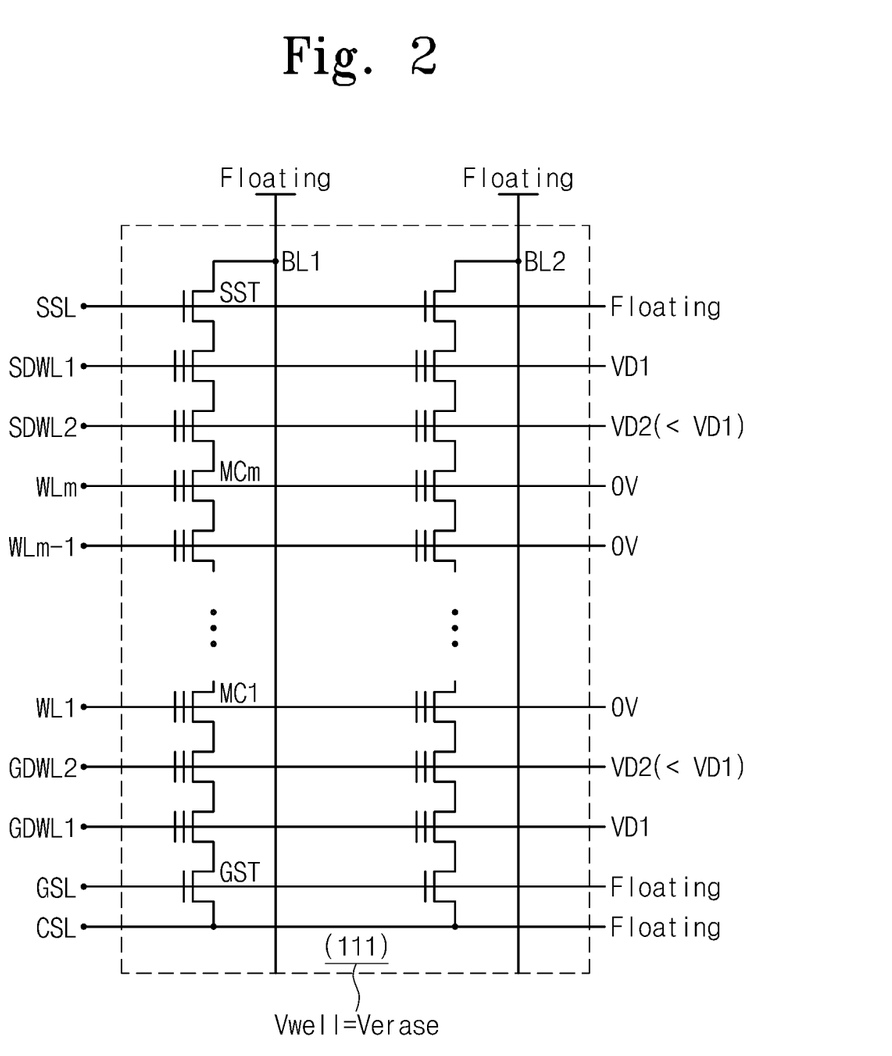
FIG. 2 is a circuit diagram illustrating a bias condition of an erase operation according to an exemplary embodiment.

FIG. 2 is a circuit diagram illustrating a bias condition of an erase operation according to an exemplary embodiment. Referring to FIG. 2, a bias condition of an erase operation may be as follows.

An erase voltage Verase may be applied to a well 111, and lines BL1, BL2, CSL, SSL, and GSL may be floated. A voltage of 0V may be applied to word lines WL1 to WLm, a first dummy voltage VD1 may be applied to a first string dummy word line SDWL1 and a first ground dummy word line GDWL1, and a second dummy voltage VD2 may be applied to a second string dummy word line SDWL2 and a second ground dummy word line GDWL2. Each of the first and second dummy voltages VD1 and VD2 may be higher than 0V and lower than the erase voltage Verase. The first dummy voltage VD1 may be higher than the second dummy voltage VD2.

In FIG. 2, there is illustrated an example in which a voltage of 0V is applied to the word lines WL1 to WLm at an erase operation. However, the inventive concept is not limited thereto. For example, a positive voltage, lower than the erase voltage Verase, can be applied to the word lines WL1 to WLm.

In example embodiments, the lines BL1, BL2, CSL, SSL, and GSL may be floated after the erase voltage Verase is applied to the lines BL1, BL2, CSL, SSL, and GSL. In other words, a floating voltage may be the erase voltage.

In example embodiments, the erase voltage Verase may be about 18V.

In example embodiments, a difference between the first dummy voltage VD1 and the second dummy voltage VD2 may be larger than a difference between the second dummy voltage VD2 and a voltage applied to a word line WL1 or WLm closest to a selection transistor SST or GST (or, a gate voltage of a memory cell).

For example, a difference between the first dummy voltage VD1 applied to the first string dummy word line SDWL1 and the second dummy voltage VD2 applied to the second string dummy word line SDWL2 may be larger than a difference between the second dummy voltage VD2 applied to the second string dummy word line SDWL2 and a voltage (e.g., 0V) applied to a word line WLm. For example, the first dummy voltage VD1 may be higher than double the second dummy voltage VD2. Since the second dummy voltage VD2 is applied to the second string dummy cell SDC2 at an erase operation, back-tunneling electrons may be reduced. Thus, a voltage difference (VD1-VD2) between the first string dummy cell SDC1 and the second string dummy cell SDC2 can increase compared with a voltage difference VD2 between the second string dummy cell SDC2 and a closest memory cell MCm.

In example embodiments, a difference between the first dummy voltage VD1 and the second dummy voltage VD2 may be smaller than a difference between the first dummy voltage VD1 and a voltage applied to a selection line SSL/GSL.

For example, a difference between the first dummy voltage VD1 applied to the first string dummy word line SDWL1 and the second dummy voltage VD1 applied to the second string dummy word line SDWL2 may be smaller than a difference (Verase−VD1) between a voltage (e.g., a floating voltage Verase of about 18V) applied to the string selection line SSL and the first dummy voltage VD1 applied to the first string dummy word line SDWL1. In other words, the second dummy voltage VD2 may be higher than a voltage (2VD1−Verase) obtained by subtracting the erase voltage Verase from double the first dummy voltage VD2. Since a voltage applied to the first string dummy cell SDC1 is higher than a voltage applied to the second string dummy cell SDC2, a voltage difference (floating−VD1) between the string selection transistor SST and the first string dummy cell SDC1 may be large.

At the erase operation of the inventive concept, a bias condition may be determined such that the first dummy voltage VD1 applied to a dummy cell SDC1/GDC1 closest to a selection line SSL/GSL is higher than the second dummy voltage VD2 applied to a dummy cell SDC2/GDC2 closest to a memory cell MC1/MCm. In this case, a sharp increase in a horizontal electric field at an erase operation may be suppressed, a charge trap phenomenon of the selection transistor SST/GST may be reduced, and an erase fail may be reduced.

The dummy voltages VD1 and VD2 may be generated by a voltage generator 130 in FIG. 1, and may be voltages being transferred to dummy word lines SDWL1/GDWL1 and SDWL2/GDWL2. However, the inventive concept is not limited thereto. For example, the dummy voltages VD1 and VD2 can be generated by the capacitive coupling by varying a point of time when gates of dummy cells are floated at an erase operation.

Figure 3:
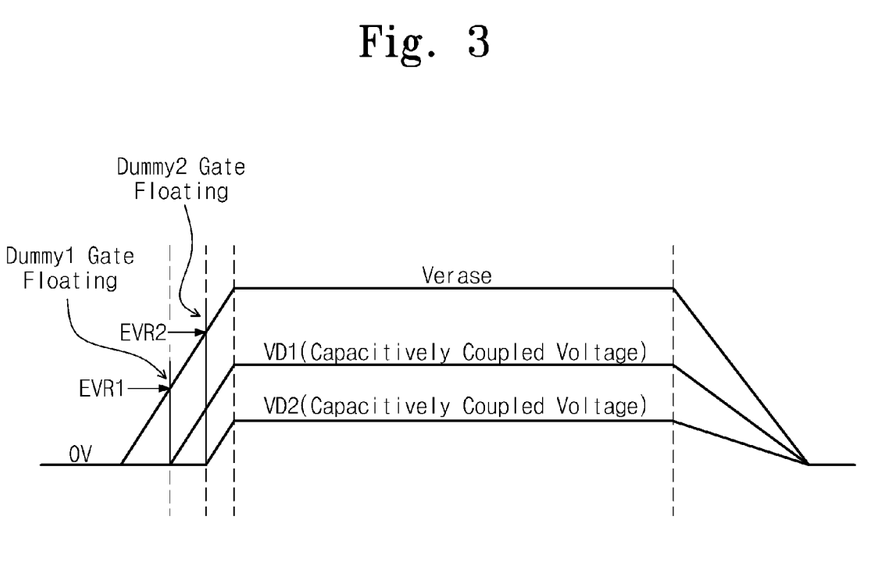
FIG. 3 is a diagram illustrating an erase operation according to another exemplary embodiment.

FIG. 3 is a diagram illustrating an erase operation according to another exemplary embodiment. Referring to FIG. 3, at an erase operation, a gate of a first dummy cell SDC1/GDC1 may be floated when an erase voltage Verase reaches a first level EVR1, and a gate of a second dummy cell SDC2/GDC2 may be floated when the erase voltage Verase reaches a second level EVR2.

In example embodiments, a voltage of 0V may be applied to the gate of the first dummy cell SDC1/GDC1 before the gate of the first dummy cell SDC1/GDC1 is floated. A voltage of 0V may be applied to the gate of the second dummy cell SDC2/GDC2 before the gate of second dummy cell SDC2/GDC2 is floated.

If the gate of the first dummy cell SDC1/GDC1 is floated, a first dummy voltage VD1 of the first dummy cell SDC1/GDC1 may gradually increase by the capacitive coupling when the erase voltage Verase increases. If the erase voltage Verase reaches a specific level, the first dummy voltage VD1 may be maintained constantly.

If the gate of the second dummy cell SDC2/GDC2 is floated, a first dummy voltage VD1 of the second dummy cell SDC2/GDC2 may gradually increase by the capacitive coupling when the erase voltage Verase increases. If the erase voltage Verase reaches a specific level, the second dummy voltage VD2 may be maintained constantly. Herein, the second dummy voltage VD2 finally generated may be lower than the first dummy voltage VD1 finally generated.

At the erase operation of the inventive concept, the dummy voltages VD1 and VD2 may be generated by the capacitive coupling by varying a point of time when gates of the dummy cells SDC1 and SDC2 or GDC1 and GDC2 are floated at an erase operation.

Figure 4:
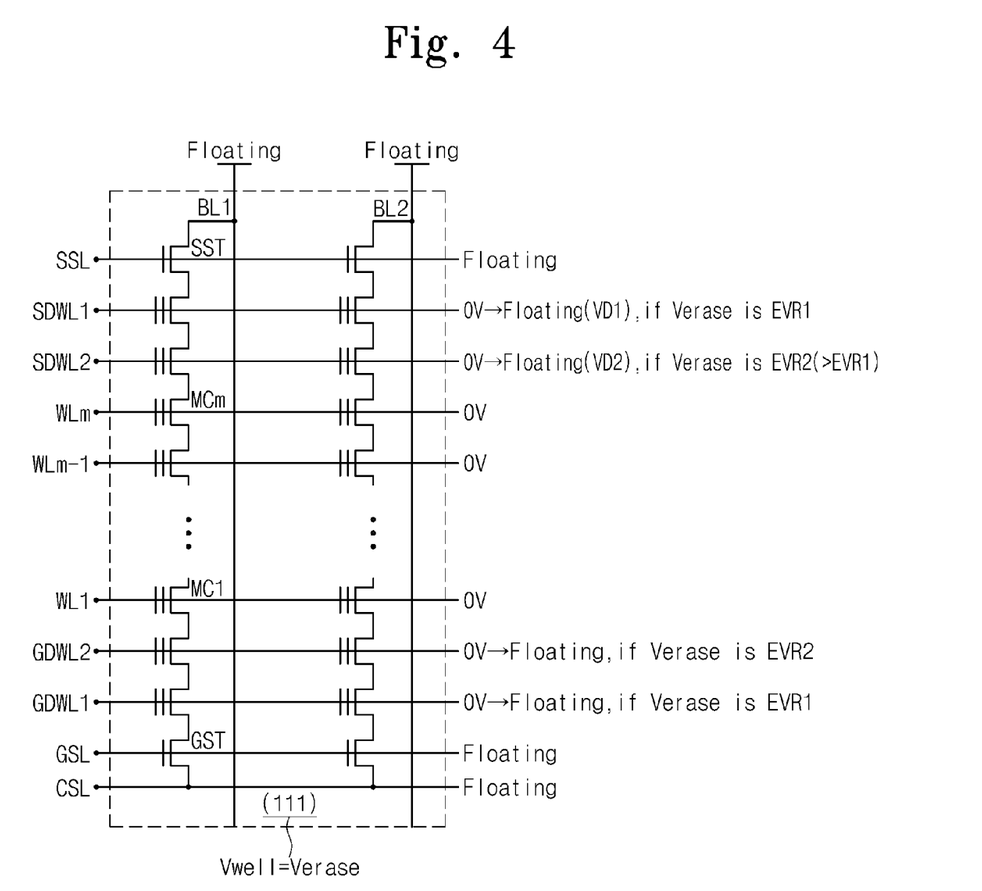
FIG. 4 is a circuit diagram illustrating a bias condition of an erase operation according to another exemplary embodiment.

FIG. 4 is a circuit diagram illustrating a bias condition of an erase operation according to another exemplary embodiment. Referring to FIG. 4, lines BL1, BL2, CSL, SSL, and GSL may be floated, an erase voltage Verase may be applied to a well 111, and a voltage of 0V may be applied to word lines WL1 to WLm. A first string dummy word line SDWL1 and a first ground dummy word line GDWL1 may be provided with a voltage of 0V, and may be floated when an erase voltage Verase reaches a first level EVR1 (refer to FIG. 3). A second string dummy word line SDWL2 and a second ground dummy word line GDWL2 may be provided with a voltage of 0V, and may be floated when the erase voltage Verase reaches a second level EVR2 (refer to FIG. 3). Herein, the first level EVR1 may be higher than the second level EVR2.

In example embodiments, in the event that the first string dummy word line SDWL1 and the first ground dummy word line GDWL1 are floated when the erase voltage Verase reaches the first level EVR1, a first dummy voltage VD1 may gradually increase by the capacitive coupling when the erase voltage Verase (or, a coupling voltage) increases.

Also, if the second string dummy word line SDWL2 and the second ground dummy word line GDWL2 are floated when the erase voltage Verase reaches the second level EVR2, a second dummy voltage VD2 may gradually increase by the capacitive coupling when the erase voltage Verase (or, a coupling voltage) increases. Herein, the first level EVR1 may be higher than the second level EVR2. Thus, a time taken to generate the first dummy voltage VD1 may be longer than a time taken to generate the second dummy voltage VD2. As a result, when the erase voltage Verase is maintained constantly, the first dummy voltage VD1 may be higher than the second voltage VD2.

Thus, the dummy voltages VD1 and VD2 having different levels may be generated by the capacitive coupling by floating a gate of a dummy cell SDC1/GDC1 closest to a selection transistor SST/GST prior to a gate of a dummy cell SDC2/GDC2 closest to a memory cell MC1/MCm.

The erase operation of the inventive concept is applicable to the shared bit line architecture in which at least two strings are connected with one bit line.

Figure 5:
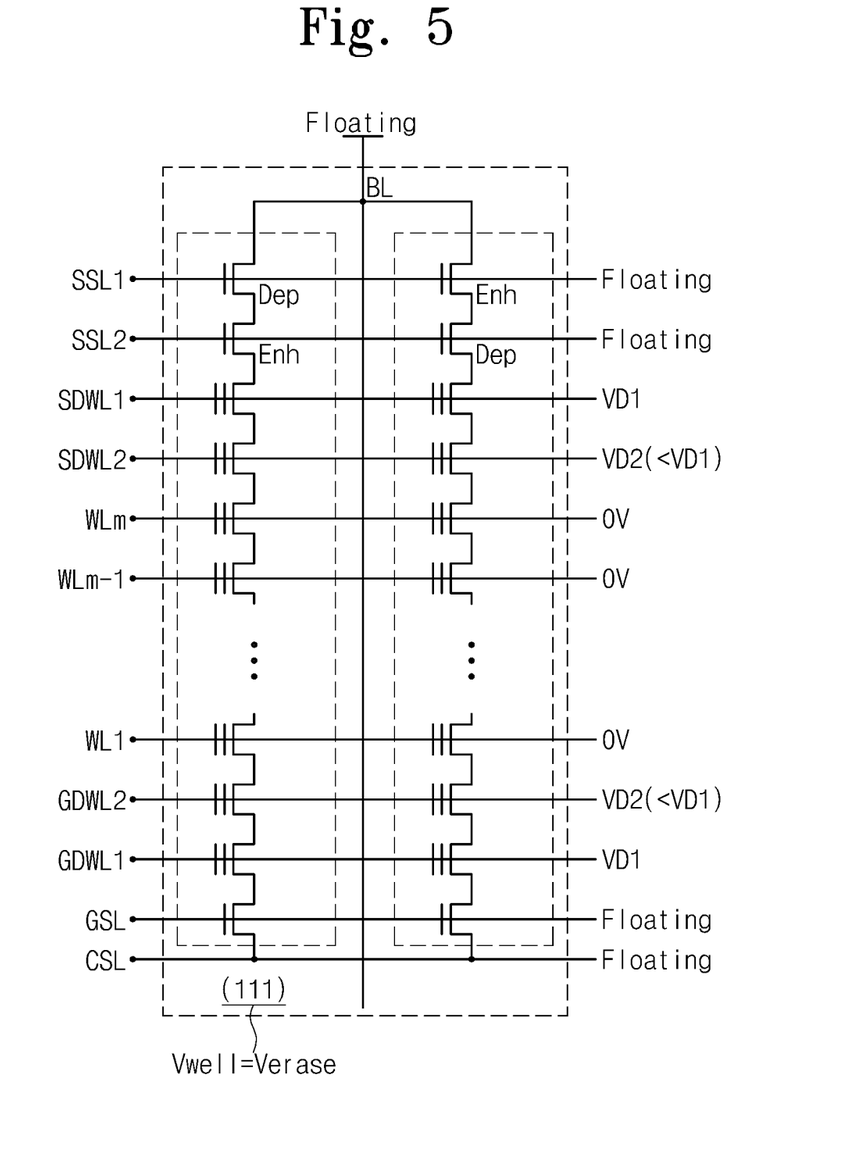
FIG. 5 is a circuit diagram illustrating a bias condition of an erase operation according to still another exemplary embodiment

FIG. 5 is a circuit diagram illustrating a bias condition of an erase operation according to still another exemplary embodiment. Referring to FIG. 5, one bit line BL may be connected with two strings ST1 and ST2. A string selection transistor may be formed of a depletion-type transistor Dep and an enhancement-type transistor Enh.

In the first string ST1, the depletion-type transistor Dep connected with a first string selection line SSL1 and the enhancement-type transistor Enh connected with a second string selection line SSL2 may be connected in series. On the other hand, in the second string ST2, the enhancement-type transistor Enh connected with the first string selection line SSL1 and the depletion-type transistor Dep connected with the second string selection line SSL2 may be connected in series.

As the depletion-type transistor Dep and the enhancement-type transistor Enh connected with a string selection line (e.g., SSL1) are driven to be complementary, according to a voltage applied to the string selection line SSL1, one of the first and second strings ST1 and ST2 may be selected.

In FIG. 5, a bias condition of an erase operation may be the same as that described with reference to FIG. 2 except that the first and second string selection lines SSL1 and SSL2 are floated. For example, at an erase operation, the first dummy voltage VD1 may be higher than the second dummy voltage VD2.

In FIG. 5, there is illustrated an example in which the first and second dummy voltages VD1 and VD2 are applied to the dummy word lines SDWL1 and SDWL2 and the dummy word lines GDWL1 and GDWL2. However, the inventive concept is not limited thereto. In the shared bit line architecture, as described with reference to FIGS. 3 and 4, gate voltages of dummy cells can be generated according to the capacitive coupling by varying a point of time when gates of the dummy cells are floated.

Figure 6:
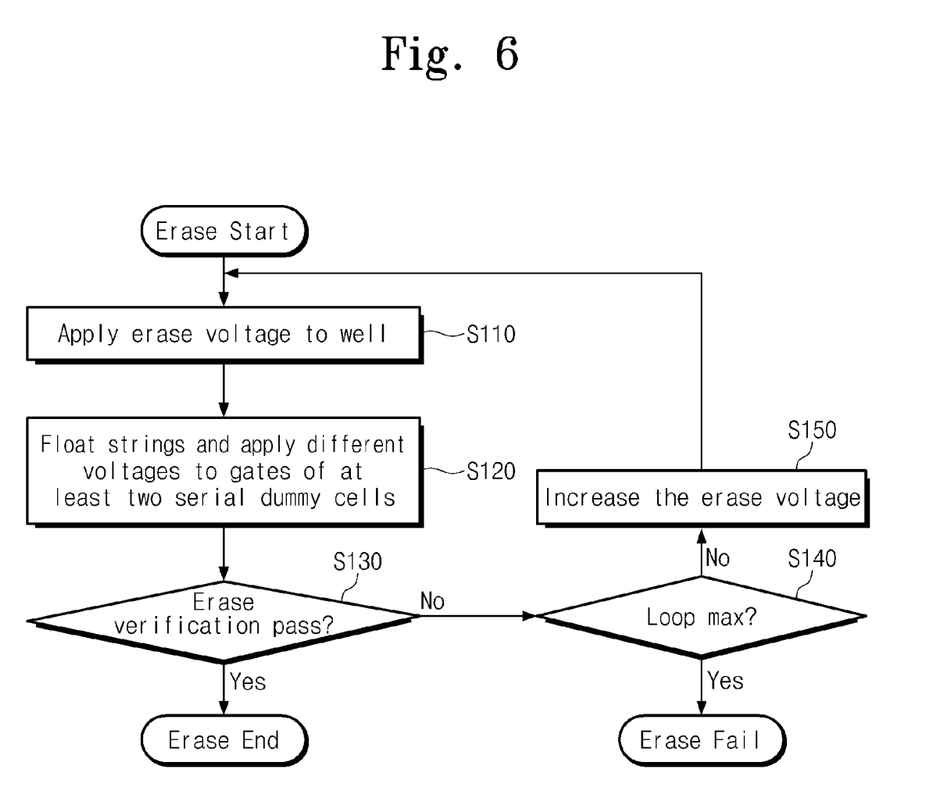
FIG. 6 is a flow chart illustrating an erase method of a nonvolatile memory device according to an exemplary embodiment.

FIG. 6 is a flow chart illustrating an erase method of a nonvolatile memory device according to an exemplary embodiment. An erase operation may be performed according to an incremental step pulse erasing (ISPE) manner.

Referring to FIGS. 1 to 6, in operation S110, if an erase command and an address are provided to a nonvolatile memory device 100 from an external device, an erase voltage Verase may be applied to a well of a selected memory block. In operation S120, voltages having different levels may be applied to gates of at least two dummy cells, which are connected in series. For example, a voltage applied to a gate of a dummy cell closest to a selection transistor SST/GST may be different from a voltage applied to a dummy cell closest to a memory cell MC1/MCm.

In operation S130, a determination may be made on whether an erase verification operation is passed. If the erase verification operation is determined to be passed, the method may be ended. In operation S140, if the erase verification operation is determined not to be passed, a determination may be made on whether a current loop is a max loop. If the current loop is the max loop, an erase operation may be ended (erase fail). If the current loop is not the max loop, the method proceeds to operation S150, in which the erase voltage Verase is increased by a predetermined increment. Then, the method proceeds to operation S110.

In the erase method of the inventive concept, different levels of voltages may be applied to gates of dummy cells.

An erase method of the inventive concept is applicable to a vertical NAND flash memory device.

Figure 7:
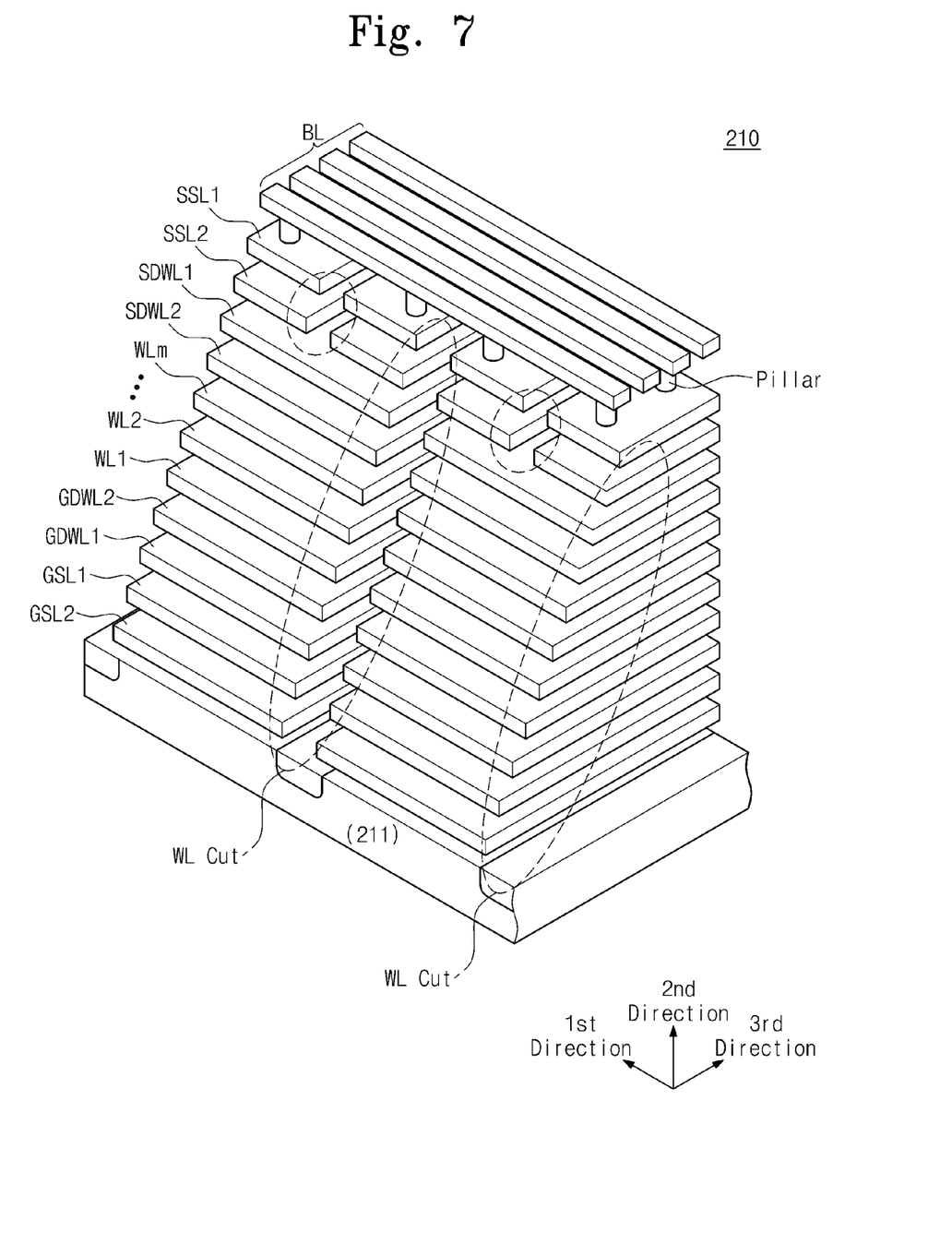
FIG. 7 is a diagram illustrating a memory block of a vertical NAND flash memory device according to an exemplary embodiment.

FIG. 7 is a diagram illustrating a memory block of a vertical NAND flash memory device according to an exemplary embodiment. Referring to FIG. 7, at least two ground selection lines GSL1 and GSL2, a plurality of word lines WL to WLm, and at least two string selection lines SSL1 and SSL2 may be stacked on a well 111 between word line cuts.

The at least two string selection lines SSL1 and SSL2 may be separated by a string selection line cut. A plurality of pillars may penetrate the ground selection lines GSL1 and GSL2, the word lines, and the string selection lines SSL1 and SSL2. Herein, the ground selection lines GSL1 and GSL2, the word lines, and the string selection lines SSL1 and SSL2 may be formed to have a substrate shape. Further, bit lines BL may be connected with upper surfaces of the pillars. A memory block may have a merged word line structure. However, the inventive concept is not limited thereto.

An erase operation according to the inventive concept may be performed by a memory block unit or a sub block unit between word line cuts. At an erase operation, different levels of voltages may be applied to string dummy lines SDWL1 and SDWL2, and different levels of voltages may be applied to ground dummy lines GDWL1 and GDWL2. The different levels of voltages may be generated by a voltage generator or inducted by the capacitive coupling.

Below, there will be described embodiments in which a nonvolatile memory device according to the inventive concept is applied.

Figure 8:
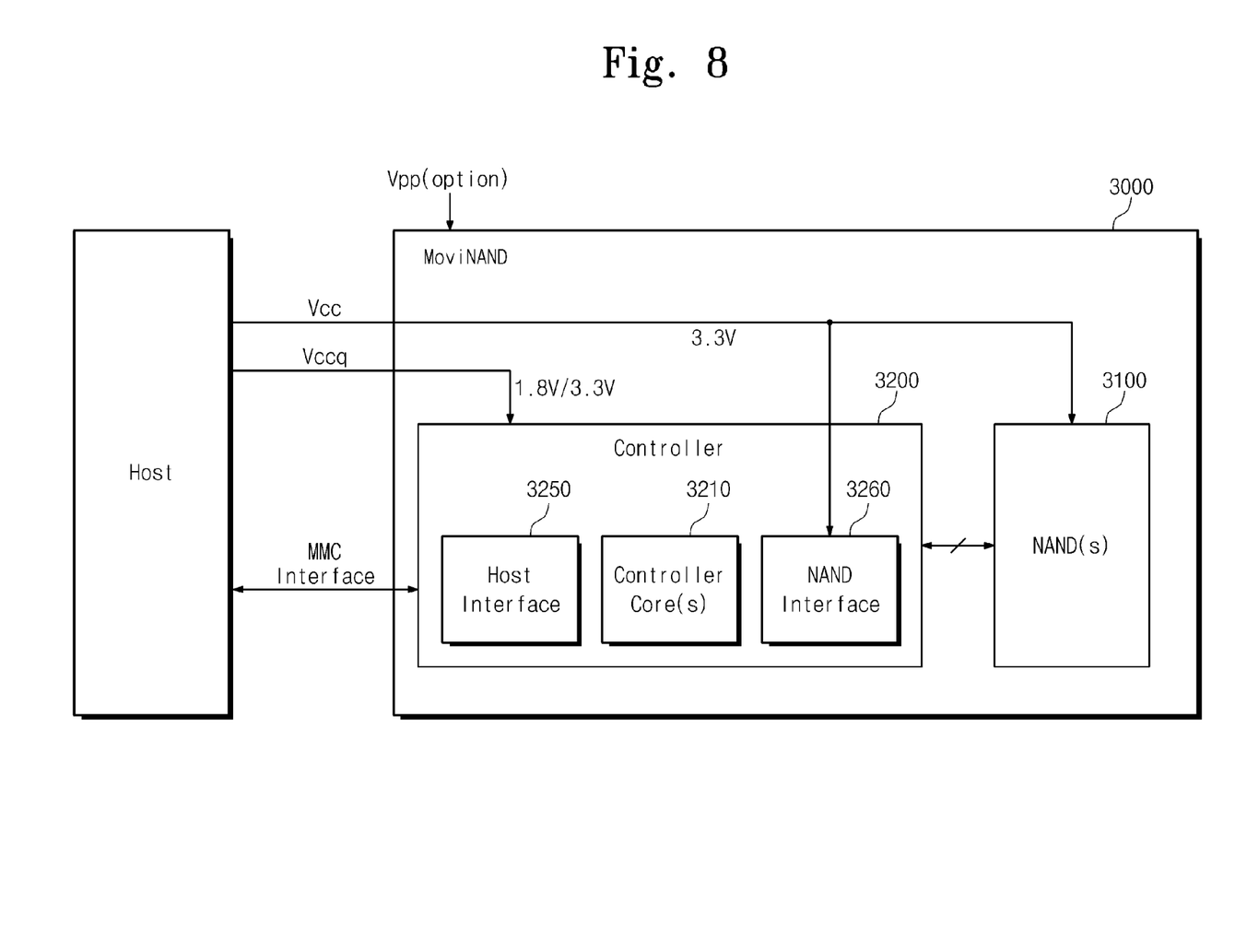
FIG. 8 is a block diagram schematically illustrating a moviNAND according to an exemplary embodiment.

FIG. 8 is a block diagram schematically illustrating a moviNAND according to an exemplary embodiment. Referring to FIG. 8, a moviNAND device 3000 may include at least one NAND flash memory device 3100 and a controller 3200. The moviNAND device 3000 may support the MMC 4.4 (or, referred to as "eMMC") standard.

The NAND flash memory device 3100 may be the same or substantially the same as that illustrated in FIG. 1. The NAND flash memory device 3100 may be a single data rate (SDR) NAND flash memory device or a double data rate (DDR) NAND flash memory device. In example embodiments, the NAND flash memory device 3100 may include NAND flash memory chips. Herein, the NAND flash memory device 3100 may be implemented by stacking the NAND flash memory chips at one package (e.g., FBGA, Fine-pitch Ball Grid Array, etc.).

The controller 3200 may be connected with the flash memory device 3100 via a plurality of channels. The controller 3200 may include at least one controller core 3210, a host interface 3250, and a NAND interface 3260. The controller core 3210 may control an overall operation of the moviNAND device 3000. The host interface 3250 may be configured to perform an MMC interface between the controller 3210 and a host. The NAND interface 3260 may be configured to interface between the NAND flash memory device 3100 and the controller 3200. In example embodiments, the host interface 3220 may be a parallel interface (e.g., an MMC interface). In other example embodiments, the host interface 3250 of the moviNAND device 3000 may be a serial interface (e.g., UHS-II, UFS, etc.).

The moviNAND device 3000 may receive power supply voltages Vcc and Vccq from the host. Herein, the power supply voltage Vcc (about 3.3V) may be supplied to the NAND flash memory device 3100 and the NAND interface 3260, while the power supply voltage Vccq (about 1.8V/3.3V) may be supplied to the controller 3200. In example embodiments, an external high voltage Vpp may be optionally supplied to the moviNAND device 3000.

The moviNAND device 3000, according to an embodiment of the inventive concept, may have advantages such as storing mass data and an improved read characteristic. The moviNAND device 3000, according to an embodiment of the inventive concept, is applicable to small and low-power mobile products (e.g., a Galaxy S, iPhone, etc.).

The inventive concept is applicable to a solid state drive (SSD).

Figure 9:
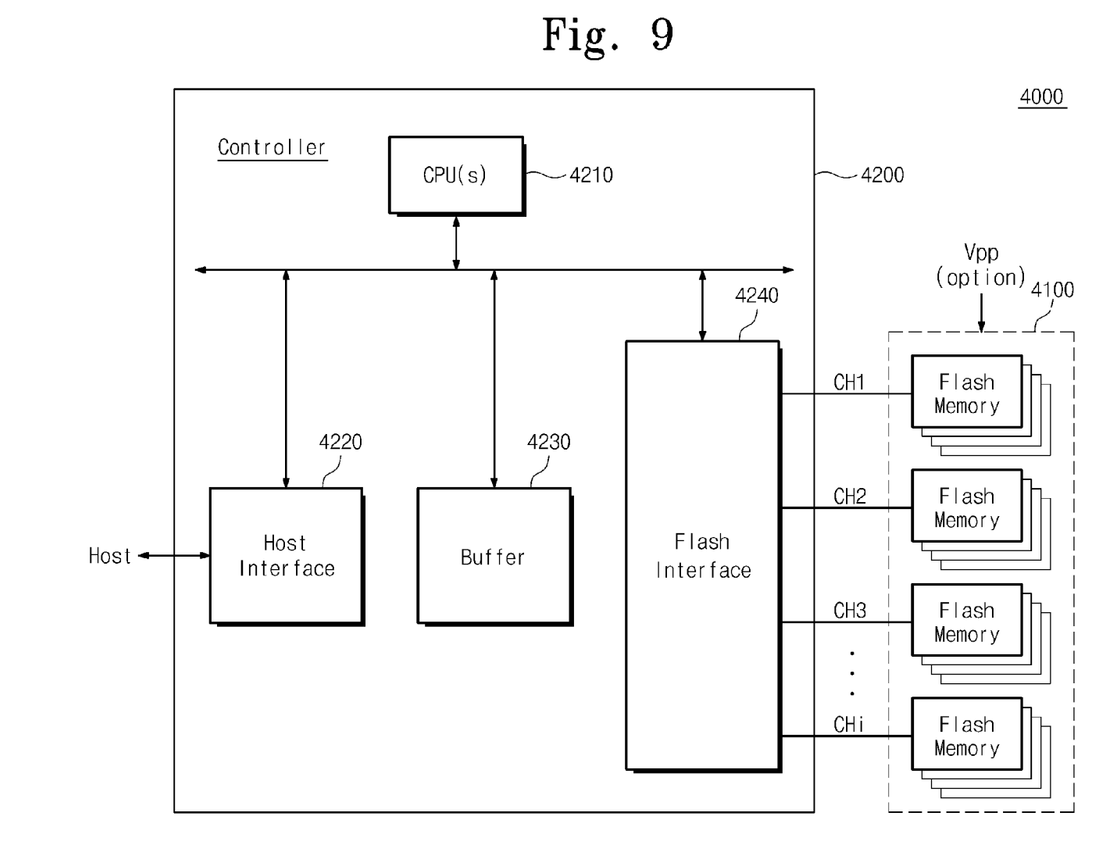
FIG. 9 is a block diagram schematically illustrating a solid state drive according to an exemplary embodiment.

FIG. 9 is a block diagram schematically illustrating a solid state drive according to an exemplary embodiment. Referring to FIG. 9, a solid state drive (SSD) 4000 may include a plurality of flash memory devices 4100 and an SSD controller 4200. Each of the flash memory devices 4100 may be configured the same or substantially the same as that illustrated in FIG. 1. An external high voltage Vpp may be optionally supplied to the flash memory devices 4100.

The SSD controller 4200 may be connected to the flash memory devices 4100 via a plurality of channels CH1 to CHi. The SSD controller 4200 may include at least one CPU 4210, a host interface 4220, a buffer memory 4230, and a flash interface 4240.

The buffer memory 4230 may be used to temporarily store data transferred between an external device and the flash memory devices 4100. The buffer memory 4230 can be used to store programs to be executed by the CPU 4210. The buffer memory 4230 may be implemented using an SRAM or a DRAM. The buffer memory 4230 in FIG. 9 may be included within the SSD controller 4200. However, the inventive concept is not limited thereto. The buffer memory 4230, according to an embodiment of the inventive concept, can be provided at the outside of the SSD controller 4200.

Under the control of the CPU 4210, the host interface 4220 may exchange data with a host through the communication protocol. In example embodiments, the communication protocol may include the Advanced Technology Attachment (ATA) protocol. The ATA protocol may include a Serial Advanced Technology Attachment (SATA) interface, a Parallel Advanced Technology Attachment (PATA) interface, an External SATA (ESATA) interface, etc. In other example embodiments, the communication protocol may include the Universal Serial Bus (UBS) protocol. Data to be received or transmitted from or to the host through the host interface 4220 may be delivered through the buffer memory 4230 without passing through a CPU bus, under the control of the CPU 4210.

The flash interface 4240 may be configured to interface between the SSD controller 4200 and the flash memory devices 4100 that are used as storage devices. The flash interface 4240 may be configured to support NAND flash memories, One-NAND flash memories, multi-level flash memories, or single-level flash memories.

The SSD 4000, according to an embodiment of the inventive concept, may improve the reliability of stored data by performing a concentration program operation for reducing power consumption of heat. A more detailed description of the SSD 4000 is disclosed in U.S. Pat. Nos. 7,802,054, 8,027,194, and 8,122,193 and U.S. Patent Publication Nos. 2007/0106836 and US 2010/0082890, the entireties of which are herein incorporated by reference.

Figure 10:
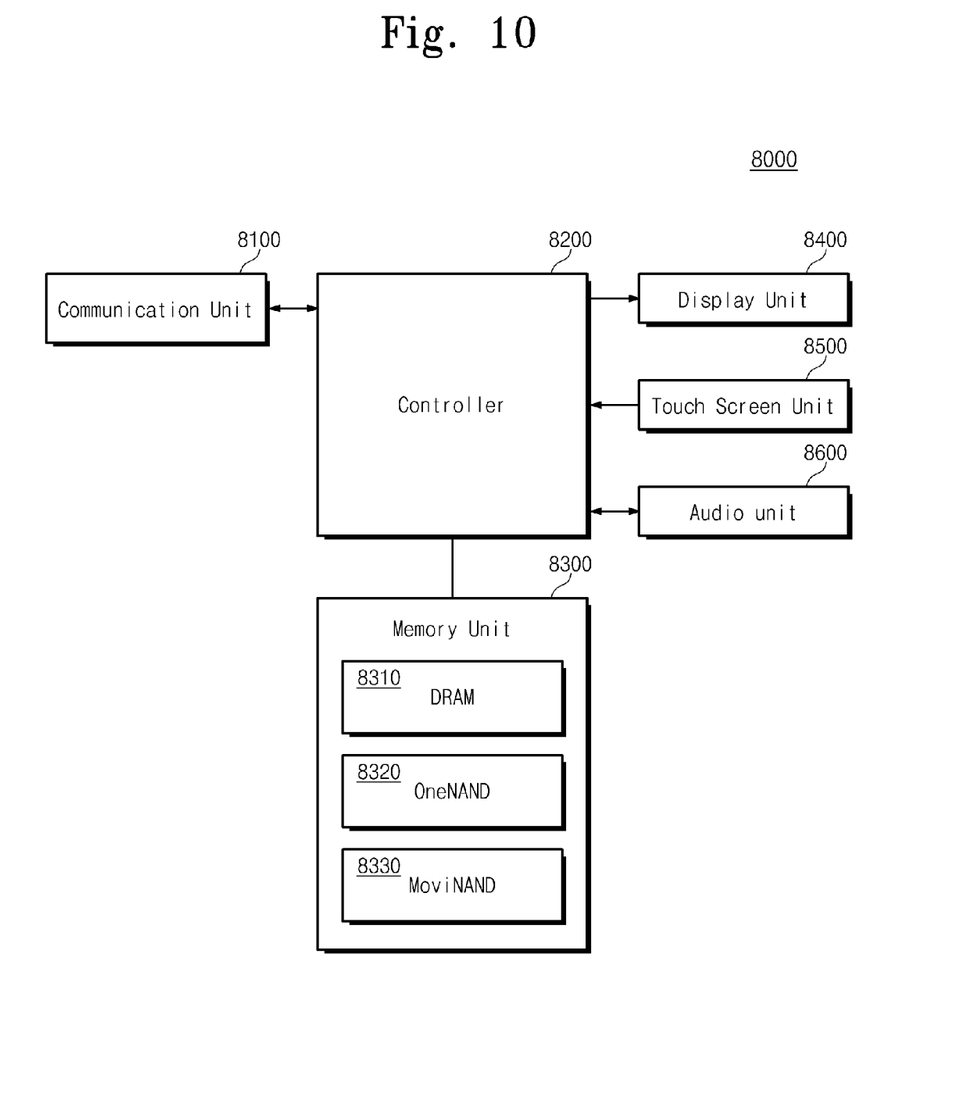
FIG. 10 is a block diagram schematically illustrating a mobile device according to an exemplary embodiment.

FIG. 10 is a block diagram schematically illustrating a mobile device according to an exemplary embodiment. Referring to FIG. 10, a mobile device 8000 may include a communication unit 8100, a controller 8200, a memory unit 8300, a display unit 8400, a touch screen unit 8500, and an audio unit 8600. The memory unit 8300 may include at least one DRAM 8310, at least one OneNAND 8320, and at least one moviNAND 8330. At least one of the OneNAND 8320 and the moviNAND 8330 may include a nonvolatile memory device 100 illustrated in FIG. 1. A detailed description of the mobile device is disclosed in U.S. Patent Publication Nos. 2010/0010040, 2010/0062715, 2010/0309237, and 2010/0315325, the entireties of which are herein incorporated by reference.

Figure 11:
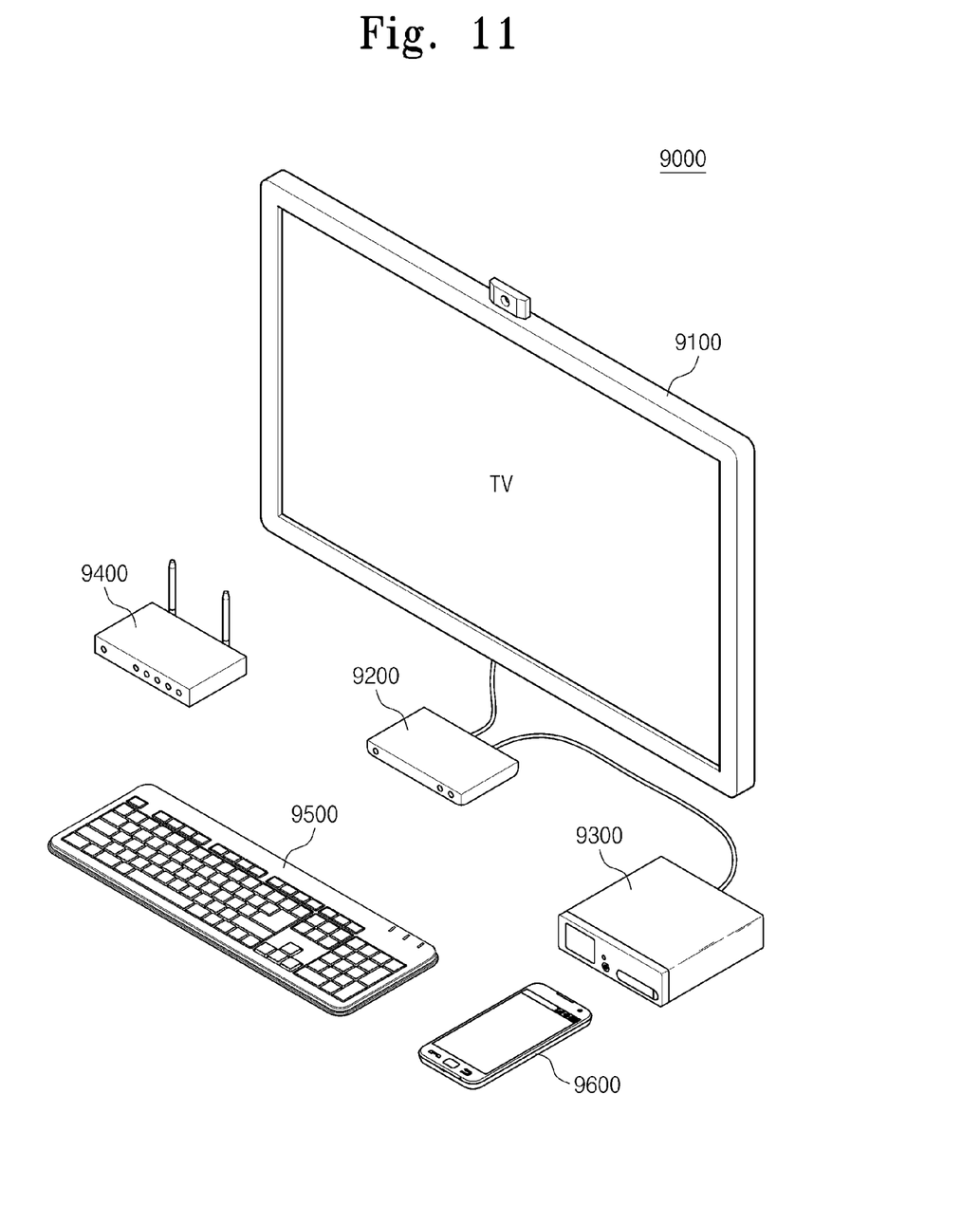
FIG. 11 is a block diagram schematically illustrating a smart TV system according to an exemplary embodiment.

FIG. 11 is a block diagram schematically illustrating a smart TV system according to an exemplary embodiment. Referring to FIG. 11, a smart TV system 9000 may include a smart TV 9100, a revue 9200, a set-top box 9300, a wireless router 9400, a keypad 9500, and a smart phone 9600. Wireless communication may be performed between the smart TV 9100 and the wireless router 9400. The smart TV 9100 may be connected with an internet through the revue 9200. The revue may be an open platform. The smart TV 9100 may enable a user to view cable and satellite broadcasting transferred through the set-top box 9300. The smart TV 9100 may be operated according to the control of the keypad 9500 or the smart phone 9600. The smart TV 9100 may include a nonvolatile memory device 100 illustrated in FIG. 1.

A memory system or a storage device according to the inventive concept may be mounted in various types of packages. Examples of the packages of the memory system or the storage device according to the inventive concept may include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

While the inventive concept has been described with reference to exemplary embodiments, it will be apparent to those skilled in the art that various changes and modifications may be made without departing from the spirit and scope of the inventive concept. Therefore, it should be understood that the above embodiments are used for illustration, but not for purposes of limitation.

What is claimed is:

1. A method of erasing a nonvolatile memory device which includes a plurality of memory blocks each formed of a plurality of strings, the method comprising:
    applying an erase voltage to a well of a selected memory block of the memory blocks, each memory block comprising at least two dummy cells located between a string or ground selection transistor and memory cells; and
    applying or inducing different levels of voltages to respective gates of the at least two dummy cells;
    wherein the respective gates of the at least two dummy cells are connected to a plurality of dummy lines,
    wherein the different levels of voltage are applied to the respective gates of the at least two dummy cells in response to the dummy lines not being floated, and
    wherein the different levels of voltages are induced to the respective gates of the at least two dummy cells in response to the dummy lines being floated.

2. The method of claim 1, further comprising:
    verifying whether the selected memory block is normally erased.

3. The method of claim 2, further comprising:
    determining whether a number of erase loops is at a maximum, when the selected memory block is abnormally erased.

4. The method of claim 3, further comprising:
    increasing the erase voltage by a predetermined increment when the number of erase loops is not at the maximum; and
    performing a next erase loop using the increased erase voltage.

5. The method of claim 1, further comprising:
    applying a voltage of 0V or a positive voltage, lower than the erase voltage, to word lines connected with memory cells of the selected memory block.

6. The method of claim 5, further comprising:
    floating a string selection line connected with a gate of the string selection transistor of the selected memory block, a ground selection line connected with a gate of the ground selection transistor of the selected memory block, a common source line of the selected memory block, and a plurality of bit lines.

7. The method of claim 1, wherein the at least two dummy cells comprises at least two string dummy cells located between the string selection transistor and the memory cells and at least two ground dummy cells located between the ground selection transistor and the memory cells.

8. The method of claim 7, wherein the at least two string dummy cells comprise a first string dummy cell closest to the string selection transistor and a second string dummy cell closest to the memory cells, or
    wherein the at least two ground dummy cells comprise a first ground dummy cell closest to the ground selection transistor and a second ground dummy cell closest to the memory cells.

9. The method of claim 8, wherein the applying or inducing different levels of voltages to respective gates of the dummy cells comprises:
    applying a first dummy voltage to a gate of the first string dummy cell or a gate of the first ground dummy cell; and
    applying a second dummy voltage to a gate of the second string dummy cell or a gate of the second ground dummy cell,
    wherein the first dummy voltage is higher than the second dummy voltage.

10. The method of claim 9, wherein a difference between the first dummy voltage and the second dummy voltage is larger than a difference between the second dummy voltage and a voltage applied to each gate of the memory cells.

11. The method of claim 10, wherein a difference between the first dummy voltage and the second dummy voltage is smaller than a difference between the first dummy voltage and a voltage applied to a gate of the string or ground selection transistor.

12. The method of claim 8, wherein the applying or inducing different levels of voltages to respective gates of the dummy cells comprises:
    applying a voltage of 0V or a positive voltage, lower than the erase voltage, to a first string dummy word line connected with a gate of the first string dummy cell or a first ground dummy word line connected with a gate of the first ground dummy cell;

generating a first dummy voltage by capacitive coupling at a gate of the first string dummy cell and a gate of the first ground dummy cell by floating the first string dummy word line and the first ground dummy word line when the erase voltage reaches a first level;

applying a voltage of 0V or a positive voltage, lower than the erase voltage, to a second string dummy word line connected with a gate of the second string dummy cell or a second ground dummy word line connected with a gate of the second ground dummy cell; and generating a second dummy voltage by capacitive coupling at a gate of the second string dummy cell and a gate of the second ground dummy cell by floating the second string dummy word line and the second ground dummy word line when the erase voltage reaches a second level.

13. The method of claim 12, wherein the first level is lower than the second level.

14. The method of claim 1, wherein the plurality of strings are configured such that two strings are connected with one bit line.

15. A nonvolatile memory device comprising:
a memory cell array including a plurality of memory blocks each formed of a plurality of strings, each string including at least one string selection transistor, string dummy cells, a plurality of memory cells, ground dummy cells, and at least one ground selection transistor connected in series between a corresponding bit line and a common source line or each string including at least one string selection transistor, string dummy cells, a plurality of memory cells, and at least one ground selection transistor connected in series between a corresponding bit line and the common source line;
an address decoder configured to select a memory block of the plurality of memory blocks according to an address;
a voltage generator configured to generate an erase voltage;
an input and output circuit connected with bit lines and configured to read data stored at the memory cells or store data at the memory cells; and
a control logic configured to control the voltage generator so as to generate the erase voltage, and the control logic configured to control the address decoder and the input and output circuit so as to perform an erase operation of the selected memory block,
wherein in each of the strings of the selected memory block, different levels of voltages are provided to gates of the string dummy cells or to gates of the ground dummy cells to reduce a horizontal electric field generated between the string or ground selection transistor and the memory cells;
wherein the gates of the string dummy cells and the ground dummy cells are connected to a plurality of dummy lines,
wherein the different levels of voltage are applied to the gates of the string dummy cells or the ground dummy cells in response to the dummy lines not being floated, and
wherein the different levels of voltages are induced to the gates of the string dummy cells or the ground dummy cells in response to the dummy lines being floated.

16. A method of erasing a nonvolatile memory device, the method comprising:
selecting a memory block of a plurality of memory blocks according to an address;
applying an erase voltage to a well of the selected memory block according to an erase command; and
applying different voltage levels to gates of at least two dummy cells connected in series;
wherein the gates of the at least two dummy cells are connected to a plurality of dummy lines,
wherein the different voltage levels are applied to the gates of the at least two dummy cells in response to the dummy lines not being floated, and
wherein the different voltages levels one induced to the gates of the at least two dummy cells in response to the dummy lines being floated.

17. The method of claim 16, further comprising:
determining whether an erase verification is passed.

18. The method of claim 17, further comprising:
determining whether a current loop is a maximum loop when the erase verification is determined to not pass.

19. The method of claim 18, further comprising:
increasing the erase voltage by a predetermined increment when the current loop is determined to not be a maximum loop; and
performing another erase loop using the increased erase voltage.

20. The method of claim 16, wherein the applying different voltage levels to gates of the at least two dummy cells comprises:
applying a first voltage to a gate of a dummy cell closest to a selection transistor; and
applying a second voltage to a gate of a dummy cell closest to a memory cell,
wherein the first voltage is different from the second voltage.

* * * * *